United States Patent [19]
Masuda et al.

[11] Patent Number: 5,300,879
[45] Date of Patent: Apr. 5, 1994

[54] BIDIMENSIONAL ELECTROMAGNETIC EMISSION LEVEL MONITORING EQUIPMENT

[75] Inventors: Norio Masuda; Noboru Fujihara; Ken-Ichi Hatakeyama; Takashi Harada, all of Tokyo; Masayuki Inomata, Miyagi, all of Japan

[73] Assignee: Nec Corporation, Japan

[21] Appl. No.: 717,087

[22] Filed: Jun. 18, 1991

[30] Foreign Application Priority Data

Jun. 18, 1990 [JP] Japan .................. 2-157599

[51] Int. Cl.⁵ .......................................... G01R 21/04
[52] U.S. Cl. .......................................... 324/95; 343/703
[58] Field of Search ............. 324/95, 77 D, 239, 240, 324/242, 244, 158 R; 343/703; 219/10.55 M, 10.55 D; 340/600

[56] References Cited

U.S. PATENT DOCUMENTS

| | | | |
|---|---|---|---|
| 4,354,153 | 10/1982 | Lentz ..................... | 324/95 |
| 4,565,967 | 1/1986 | Eisenbrandt et al. ......... | 324/95 |
| 4,829,238 | 5/1989 | Goulette et al. ............. | 324/95 |
| 5,006,788 | 4/1991 | Goulette et al. ............. | 324/95 |
| 5,028,866 | 7/1991 | Wiese ..................... | 324/95 |

Primary Examiner—Vinh Nguyen
Attorney, Agent, or Firm—Ostrolenk, Faber, Gerb & Soffen

[57] ABSTRACT

Bidimensional electromagnetic emission level monitoring equipment for detecting the electric fields or the magnetic fields of RF (Radio Frequency) emissions from equipment under test by moving an electromagnetic probe bidimensionally. The measuring frequency, the scanning range of the probe, and the distance between measuring points are entered on a keyboard of a controller. A spectrum analyzer selectively receives RF emissions of a designated frequency from the probe in response to an instruction from the controller and feeds emission level signal data to the controller as digital signals. A probe scanning section loaded with the probe is moved bidimensionally by a motor driver under the control of the controller. The controller delivers to a display an emission level distribution signal representative of an electromagnetic distribution based on the emission level data and position data associated with the probe.

8 Claims, 8 Drawing Sheets

BIDIMENSIONAL ELECTROMAGNETIC EMISSION LEVEL MONITORING EQUIPMENT

BACKGROUND OF THE INVENTION

1. Field of the Invention

The present invention relates to bidimensional electromagnetic emission level monitoring equipment and, more particularly, to bidimensional electromagnetic emission level monitoring equipment of the type measuring the electromagnetic field distribution of RF (Radio Frequency) emissions from electronic or similar equipment in a bidimensional plane.

2. Description of the Background Art

Regulations regarding the level of RF emissions from electronic equipment are prescribed in various countries to prevent RF emissions from disturbing the operations of the other electronic equipment. In the U.S.A., for example, FCC (Federal Communications Commission) Regulations, Part 15, Subpart J prescribes the regulation for 30 megahertz to 1 gigahertz RF emissions. Manufacturers of electronic equipment have to accurately evaluate the level of RF emissions from designed equipment and produce equipment meeting the regulations.

One conventional method available for measuring the level of RF emissions from electronic equipment consists of rotating the equipment under test (EUT) on a turntable, receiving RF emissions from the EUT with an antenna which is fixed or moved monodimensionally, and measuring the received emission levels. Such a method is extensively used to determine whether or not electronic equipment meets the prescribed RF emission level.

The prerequisite for the above-described method is that the antenna be located at a predetermined distance from the EUT so as not to strike against the latter. Especially, when the EUT has a quadrilateral or similar configuration having projections and recesses, the antenna has to be placed a great distance from the EUT. Since the distance between the antenna and the EUT is great as mentioned and since it changes, it is difficult to locate the source of RF emissions accurately. This makes it difficult to evaluate RF emissions of electronic equipment at the design stage.

Another method for measuring RF emissions from electronic equipment is disclosed in U.S. Pat. No. 4,829,238. Bidimensional magnetic emission level monitoring equipment disclosed in this U.S. Patent has antennas (magnetic probes) arranged in a matrix in a bidimensional plane for receiving RF emissions. The equipment has a measuring circuit which sequentially accesses RF emissions from an EUT which are received by the individual antennas, thereby determining bidimensional magnetic emission levels. A display displays the magnetic emission levels produced by the measuring circuit on a bidimensional screen thereof. This kind of monitoring equipment successfully produces accurate location data representative of the source of RF emissions of the EUT. However, such equipment is complicated and expensive due to the number of receiving antennas and does not allow the range for measuring the bidimensional magnetic emission level distribution or the distance between measuring points to be set as desired. Furthermore, an accurate electromagnetic emission level distribution is not achievable unless the great number of antennas have the same sensitivity, resulting in time-consuming adjustment.

BRIEF SUMMARY OF THE INVENTION

Object of the Invention

It is therefore an object of the present invention to provide bidimensional electromagnetic emission level monitoring equipment capable of monitoring an electromagnetic emission level distribution with accuracy.

It is another object of the present invention to provide bidimensional electromagnetic emission level monitoring equipment capable of performing rapid measurement.

Summary of the Invention

Bidimensional electromagnetic emission level monitoring equipment detects one or both the magnetic and electric fields of RF emissions from an EUT by use of at least one probe (a probe sensitive to electric fields and a probe sensitive to magnetic fields will hereinafter be referred to as an electric probe and a magnetic probe, respectively, or referred to as an electromagnetic probe collectively). The RF emissions detected by the electromagnetic probe are applied to a spectrum analyzer. The spectrum analyzer selectively receives only the signals having a frequency designated by the operator from the RF emissions, amplifies the received signals to a predetermined level, digitizes the amplified signals, and then delivers them to a controller as emission level signal data representative of detected magnetic emission levels. Mounted on a probe scanning section, the electromagnetic probe detects the bidimensional electromagnetic fields of RF emission from the EUT according to bidimensional scanning effected by the probe scanning section. Therefore, during the measurement, the EUT is held stationary while the electromagnetic probe is moved bidimensionally. The operator operates a keyboard or similar inputting means incorporated in the controller for entering a measuring frequency, an origin for measurement, a distance between measuring points, and other measuring parameters. In response, the controller delivers the measuring frequency to the spectrum analyzer. Based on the origin and the distance between measuring points (these will be referred to as scanning parameters), the controller generates position data representative of the position of the electromagnetic probe for detection, i.e., a position where the probe is expected to measure magnetic fields. Then, the controller transforms the position data to data representative of a displacement of the electromagnetic probe. Such displacements are sequentially fed to a motor driver as scanning control signals according to a scanning sequence. The motor driver converts each scanning control signal to the number of pulses corresponding to the displacement of the probe scanning section and feeds the pulses to a stepping motor included in the probe scanning section. In response, the stepping motor moves a probe holder included in the probe scanning section along the x and z axes a distance matching the number of input pulses. As a result, the electromagnetic probe mounted on the probe holder is moved bidimensionally to detect the bidimensional electromagnetic RF emission fields from the EUT.

The controller reads the emission level signal data at each measuring point of the electromagnetic probe and, based on this signal data, calculates electric or magnetic emission levels, i.e., electromagnetic emission levels by using a predetermined equation. The results of calculation may be divided into a plurality of zones. The calculated electromagnetic emission levels are transferred to a display together with associated position data as emission level distribution signals. The display shows the electromagnetic emission levels of RF emissions in response to the emission level distribution signals and according to a predetermined displaying method. When the interval between the measuring points is great, the interval may be interpolated to increase the number of emission level distribution signals to thereby make the distribution easy to see on the display.

As stated above, the bidimensional electromagnetic emission level monitoring equipment displays the bidimensional electromagnetic emission level distribution of RF emissions from an EUT.

In a preferred embodiment, the probe scanning section has a base in the form of a plate for supporting the entire probe scanning section, four first guidance bars extending vertically from four corners of the base. A top plate to which the first guidance bars are affixed are at the upper end of the base. A cross bar is positioned parallel to the base and driven by a first drive transmission mechanism to move up and down (in the z axis direction) while being guided by the first guidance bars. Specifically, the cross bar is driven by a first belt at each of opposite ends thereof to slide up and down along the four first guidance bars. Each of the first belts passes over first pulleys which are affixed to opposite ends of the first guidance bar through the base and top plate and is driven linearly by the pulleys. Each of the first belts is affixed to the cross bar at one point thereof. In this configuration, the first belts and cross bar are driven up and down along the first guidance bars by the first pulleys. The first pulleys mounted on opposite ends of the base and the first pulleys mounted on opposite ends of the top plate are each interconnected by a shaft, so that the two first belts may be driven at the same speed and by the same amount to control the position of the side bar more accurately. One of the pulleys is driven by a first stepping motor.

A second guidance bar is mounted on the cross bar and extends between opposite ends of the latter. The probe holder supporting the electromagnetic probe is driven by a second drive transmission mechanism to slide in the horizontal direction (x axis) while being guided by the second guidance bar. Specifically, a second belt passes over pulleys mounted on opposite ends of the cross bar and is affixed to the probe holder at one end thereof. The probe holder is driven by the linear motion of the second belt. The second pulleys are driven by a second stepping motor. The first and second stepping motors are each driven by a shift signal in the form of pulses applied from the motor driver.

A plurality of electromagnetic probes may be used. For example, an electromagnetic probe may be mounted on each of two probe holders each taking charge of one half of the scanning distance in the x direction. When the electromagnetic fields of RF emissions are detected by the two electromagnetic probes, on a time division basis, the scanning speed in the scanning plane is approximately doubled to promote rapid measurement of electromagnetic field distribution. If the same scanning time as in the case with a single electromagnetic probe is allowable, the probe scanning distance can be approximately doubled. Further, a single probe holder may be loaded with different kinds of electromagnetic probes in order to compare the emission characteristics of RF emissions in association with detection characteristics particular to the individual probes.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENT

Figure 1:
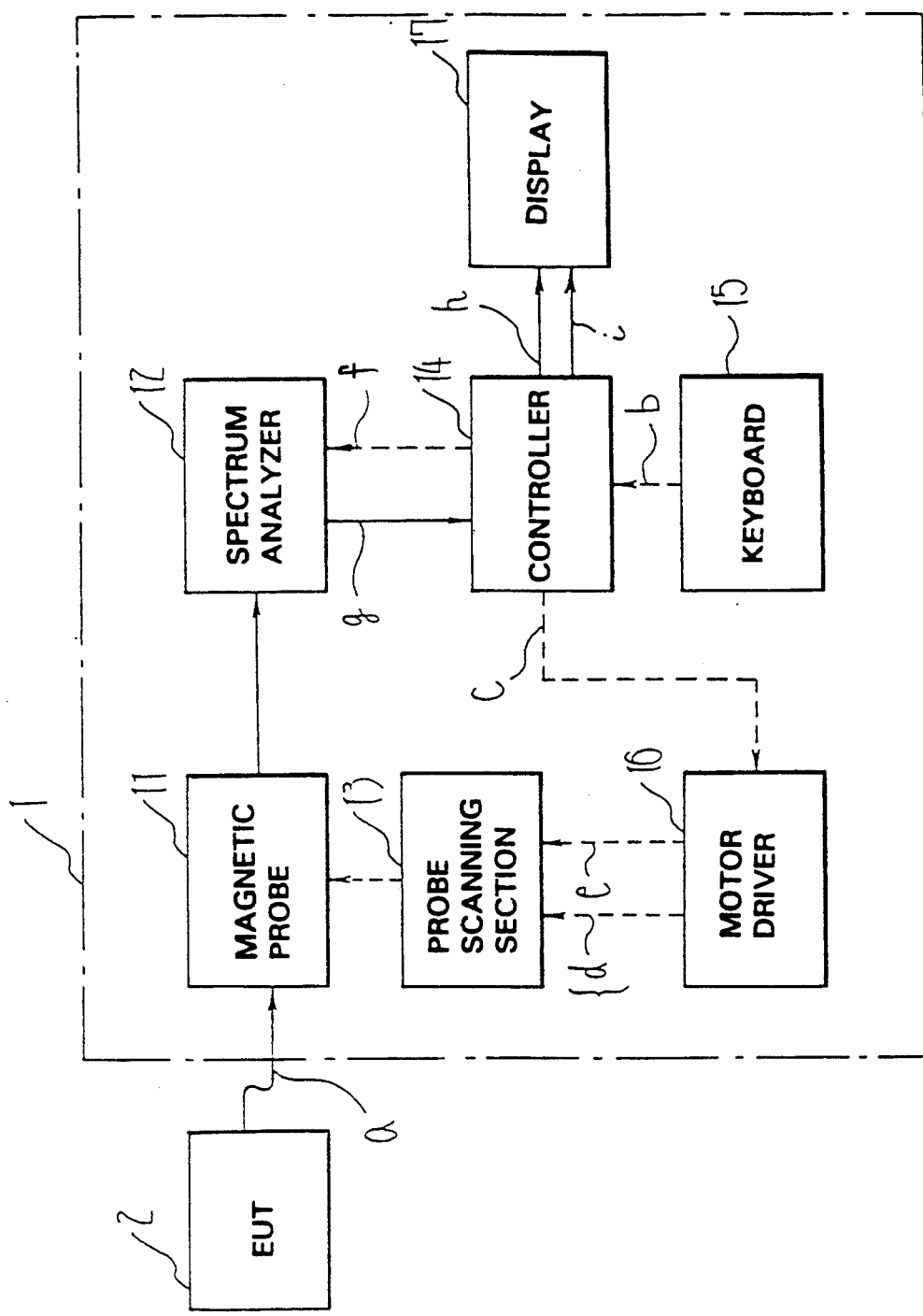
FIG. 1 is a block diagram schematically showing bidimensional electromagnetic emission level monitoring equipment embodying the present invention.

Referring to FIG. 1, bidimensional electromagnetic emission level monitoring equipment embodying the present invention is shown and generally designated by the reference numeral 1. As shown, the equipment 1 monitors bidimensionally the electromagnetic emission level distribution of RF emissions a from an EUT 2. Let the equipment 1 be assumed to measure the magnetic components of the electromagnetic fields of the RF emissions a by way of example. A magnetic probe 11 detects the magnetic fields of the RF emissions a and applies them to a spectrum analyzer 12. The magnetic probe 11 is mounted on a probe holder included in a probe scanning section 13 and is moved bidimensionally together with the probe holder. A controller 14 includes a microprocessor or similar CPU and necessary memory means such as a program memory and a temporary memory circuit. A keyboard 15 is operable to input to the controller 14 various measuring parameters b such as the measuring frequency of the RF emissions a and scanning parameters associated with the probe 11 which is moved by the probe scanning section 13. Any suitable measuring parameters b can be selected so long as they match the object of monitoring, e.g., the required accuracy of measurement or the dimensions of the EUT.

The controller 14 generates position data i representative of the monitoring position of the probe 11 according to the scanning parameters. Then, the controller 14 transforms the position data i to scanning data representative of a displacement of the probe 11 and feeds the scanning data to a motor driver 16 as a scanning control signal c. The controller 14 also feeds the position data i to the display 17, as later described. The motor driver 16 converts the scanning control signal c to shift signals d and e for driving the probe holder of the probe scanning section 13. The probe scanning section 13 moves the probe holder as instructed by the shift signals d and e. The probe scanning section 13 has two stepping motors for driving the probe holder, i.e., the probe 11 along the x (horizontal) and z (vertical) axes. Therefore, each of the shift signals d and e generated by the motor driver 16 is a sequence of pulses the number of which corresponds to the displacement of the probe holder, thereby controlling the rotation angle of the stepping motors.

The spectrum analyzer 12 tunes to a particular frequency indicated by a designated frequency signal f which the controller 14 produces from, among the monitoring parameters b, the monitoring frequency. The equipment 1 handles only that frequency of the RF emissions a detected by the probe 11 designated RF emission a0 (having the above-mentioned designated frequency as a received signal). The spectrum analyzer 12 receives only the components having the designated frequency, amplifies them to an adequate level, transforms the amplified components to numerical data, and transfers the numerical data to the controller 14 as emission level signal data g representative of the emission levels of detected magnetic fields.

The controller 14 calculates the position data of the probe 11 beforehand on the basis of the scanning parameters entered on the keyboard 15. Every time the emission level signal data g is inputted, the controller 14 calculates the magnetic emission level at the point where the probe 11 is located, i.e., the measuring point. The result of that calculation is fed to a display 17 as an emission level distribution signal h together with the position data i. The display 17 displays the magnetic emission levels of the RF emissions a0 bidimensionally in response to the emission distribution signals h, according to a predetermined displaying method. Such a measuring procedure is repeated until the measurement instructed by the scanning parameters is completed. All the results of measurement appear on the display 17 in the above-stated manner.

In the illustrative embodiment, the probe 11 may be implemented as a loop antenna. To measure the electric emission levels of the RF emissions a0, the magnetic probe 11 may be replaced with a dipole antenna or similar electric probe capable of detecting electric fields. Such an electric probe will also be mounted on the probe scanning section 13. Further, the magnetic probe 11 and an electric probe may both of be mounted on the single probe holder of the probe scanning section 13 so as to read the output signals of thereof on a time division basic. With this combination scheme, it is possible for the spectrum analyzer 12 to measure an electric field and a magnetic field at the same time and, therefore, to compare the electric and magnetic emission levels of the RF emissions a. If desired, the probe scanning section 13 may be provided with two independent probe holders each taking charge of one half of the scanning distance in the x direction, and a single electromagnetic probe may be mounted on each of the two probe holders. In such a case, the electromagnetic fields of the RF emissions a will be detected on a time division basis in response to the outputs of the two probes, approximately doubling the scanning speed in the scanning plane and thereby enhancing rapid measurement. In other words, if the same scanning time as in the case with a single electromagnetic probe is allowable, the scanning distance of the electromagnetic probe is approximately doubled.

The spectrum analyzer 12 is capable of selectively receiving the frequency range of the RF emissions a to be measured. An interface bus such as GP-IB interfaces the spectrum analyzer 12 to the controller 14 regarding the designated frequency signal f and numerical emission level signal data g. The spectrum analyzer 12 may be replaced with selective receiving means having a selective receiving function and digital converting means for converting the analog output of the selective receiving means to a digital signal. In this case, the two means have to be interfaced to the controller 14.

To cause the display 17 to show the electromagnetic emission level distribution of the RF emissions a0 thereon, the emission levels may be divided into a plurality of zones so as to display such zones in different dot intensities. The electromagnetic emission level distribution may be displayed in different colors, if desired. When the nearby measuring points are spaced apart by a substantial distance, the controller 14 may increase the number of emission level distribution signals h by interpolating the interval between the measuring points. This is makes the distribution on the display 17 easy to see.

The designated frequency which the spectrum analyzer 12 selectively receives is open to choice and may be a frequency assumed to indicate the maximum value of RF emissions which the EUT 2 emits or a frequency of interest. The probe scanning section 13 carrying the magnetic probe 11 therewith is positioned at a suitable distance from the EUT 2 before the measurement.

Figure 2A:
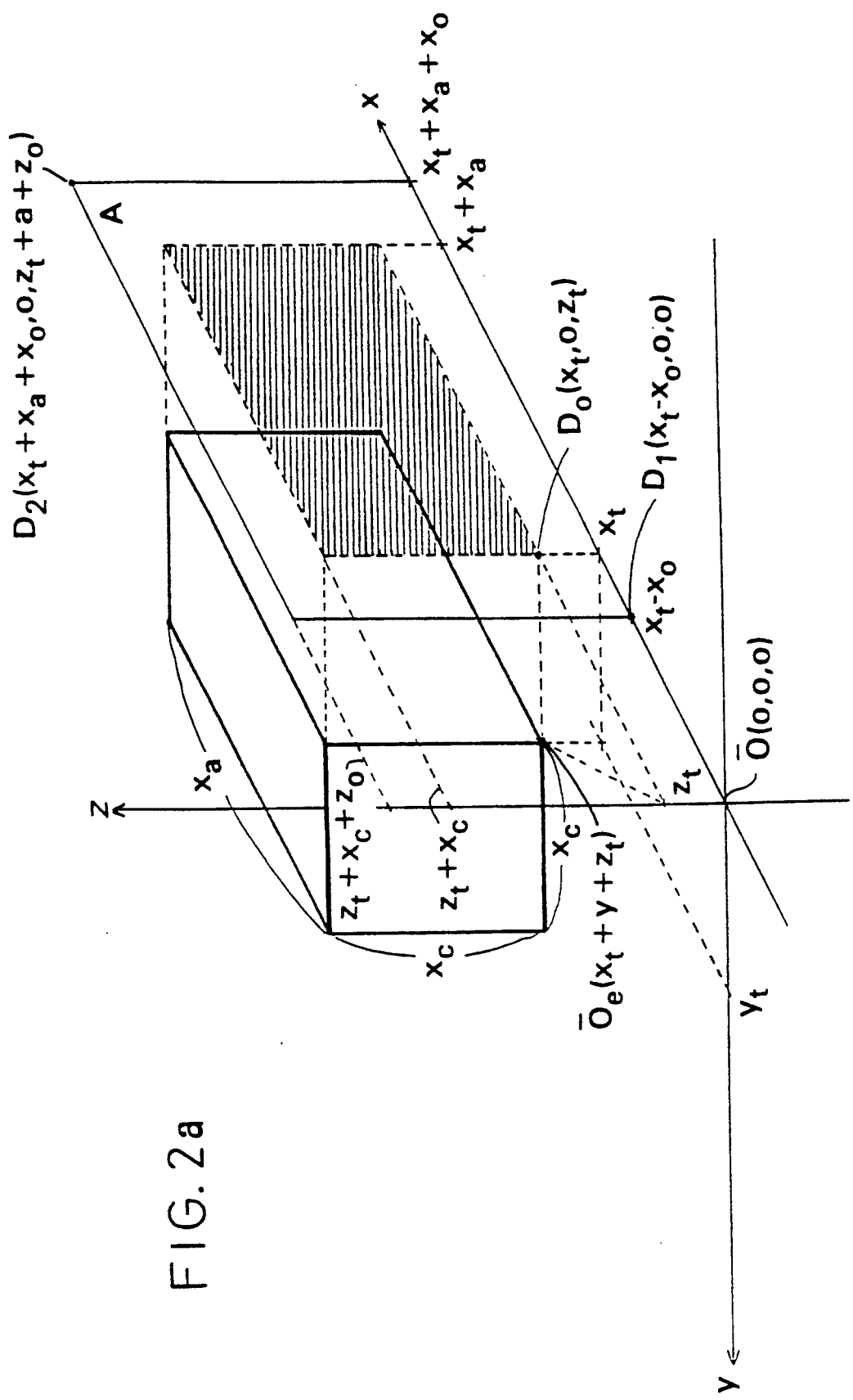
FIG. 2a shows coordinates representative of a positional relation between a probe and an EUT.

Referring to FIG. 2a, a positional relation between the magnetic probe 11 and the EUT 2 of the illustrative embodiment is shown in tridimensional coordinates. As shown, assume that the equipment 1 measures the RF emissions a from the EUT 2 in an xz plane which is spaced apart from the EUT 2 by a distance $y_t$ and the EUT has dimensions $x_a$, $x_b$ and $x_c$ to the x, y and z axes, respectively. Then, the probe 11 is located at a point in the xz plane. The origin of the EUT 2 is located at $\overline{O}_E$ ($x_t$, $y_t$, $z_t$).

The measurement is executed over an area on the xz plane larger than a projection of the EUT. In FIG. 2, the measurement area is designated by A and the projection of the EUT is represented by a hatched area. Therefore, the probe starts to move from $D_1$ ($x_t - x_0$, 0, 0).

Figure 2B:
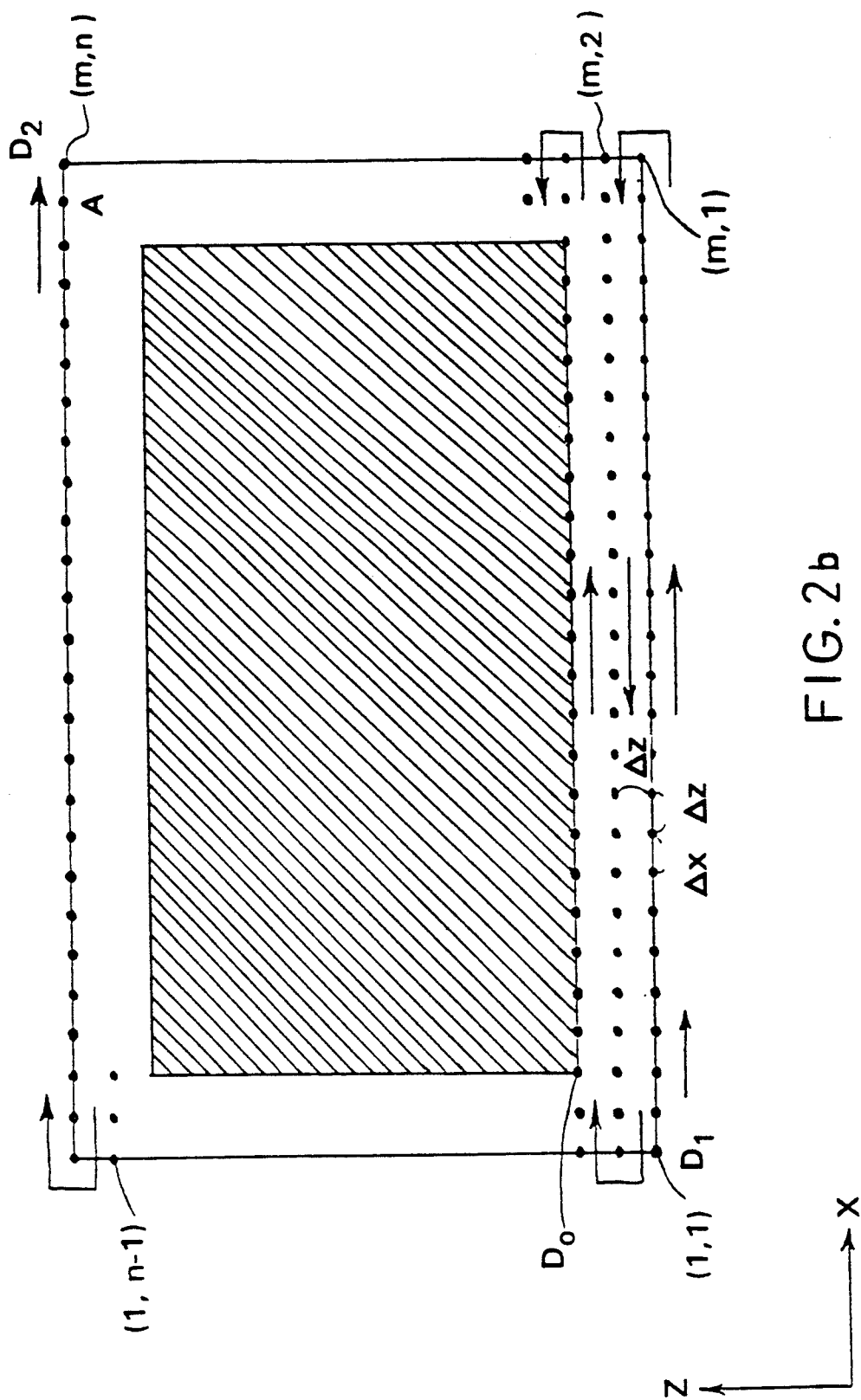
FIG. 2b shows a probe scanning direction and measuring points.

Referring to FIG. 2b, measuring points and probe scanning are described in more detail. FIG. 2b shows the measuring area A including the projection of the EUT (hatched area). Now assumed that the measuring area has m×n measuring points where m is the number of points divided by an interval $\Delta x$ in the x direction and n is the number of points divided by an interval $\Delta z$ in the direction z. The probe starts from the point $D_1$ and moves by $\Delta x$ at a time in the right direction. The RF emission is measured at every measuring point. When the probe reaches at a right side of the measuring area A, the probe turns to the z direction and moves in the z direction by $\Delta z$. Then, the probe changes the direction to the left and moves by $\Delta x$ at a time along the x axis. When the probe reaches at the left side of the measuring area A, the similar probe movement mentioned above is performed. The measuring continues until the probe reaches the point $D_2$. The gist is that the distance $y_t$ between the equipment 1 and the EUT 2, the origin for measurement $D_1$ ($x_t - x_0$, 0, 0) and the distances $\Delta x$ and $\Delta z$ between measuring points be selected to match the nature of the EUT 2 and the required accuracy. The origin $D_1$ ($x_t - x_0$, 0, 0) and the distances $\Delta x$ and $\Delta z$ are inputted to the controller 14 via the keyboard 15 as scanning parameters. It is necessary that the probe scanning section 13 be so located so as to provide the desired distance $y_t$ between the probe 11 and the EUT 2 beforehand.

Figure 3:
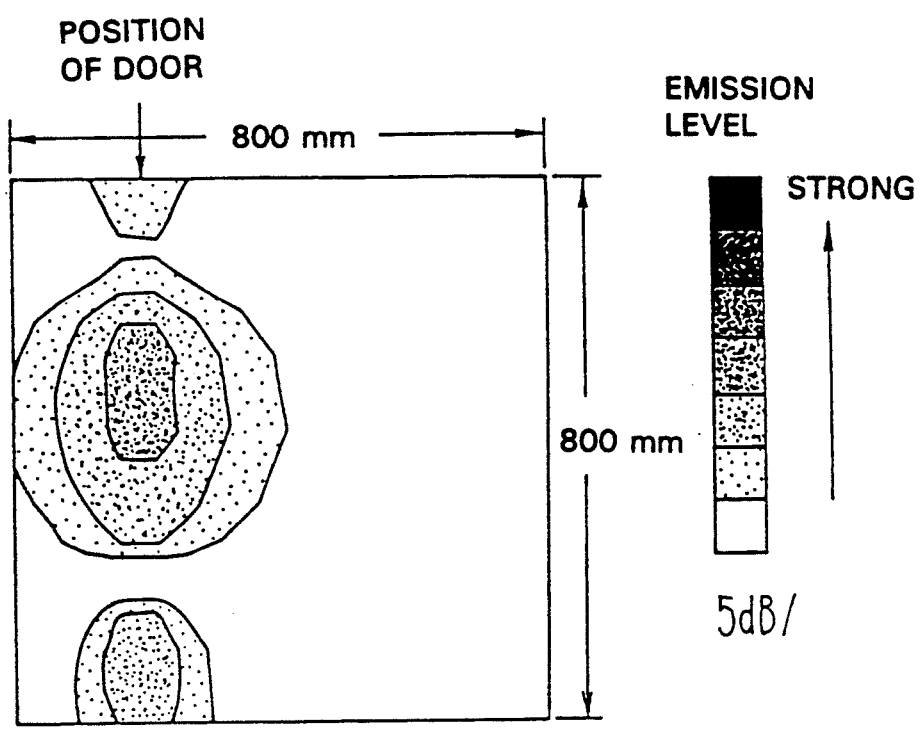
FIG. 3 shows a specific condition wherein a bidimensional electromagnetic emission level distribution is displayed in the embodiment.

FIG. 3 shows a specific condition wherein the display 17 shows bidimensionally the magnetic emission levels of the RF emissions a0 having a frequency of 40 megahertz and being emitted by electronic equipment mounted on a 19-inch rack. The 19-inch rack is 600 millimeters wide, 600 millimeters deep, and 1,600 millimeters high. The probe 11 is spaced from the front end of the 19-inch rack by 50 millimeters ($y_t$ = 50 millimeters, FIG. 2a) and moved by 800 millimeters in both of the x and z directions. The measured magnetic emission level distribution of the RM emissions a0 is represented by seven successive levels of dot intensities on the display 17. The specific condition shown in FIG. 3 indicates that the source of medium RF emissions a0 exists in close proximity to the closed door of the rack. If course, the successive levels of dot intensities may be replaced with different colors.

Figure 4:
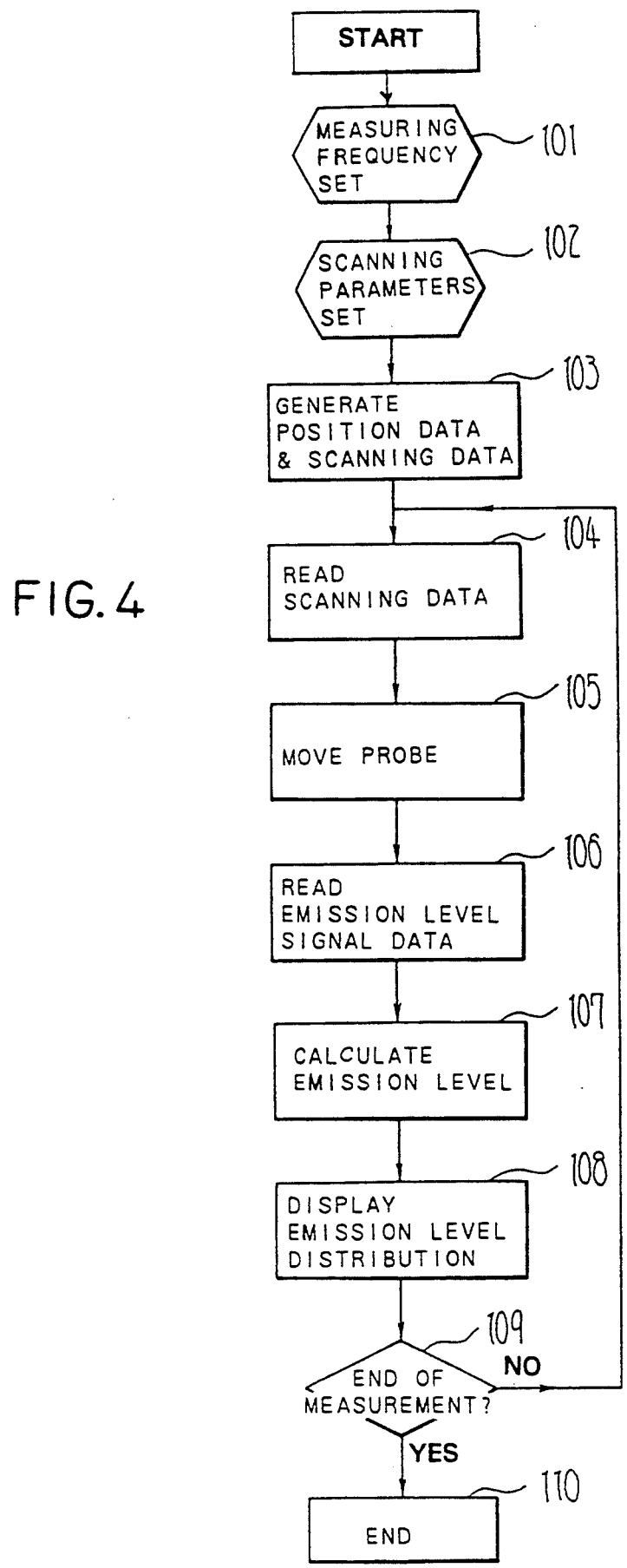
FIG. 4 is a flowchart demonstrating a specific operation of a controller included in the embodiment.

Reference will be made to FIGS. 4, 1 and 2a to describe a specific operation of the controller 14 of the illustrative embodiment. The person intending to measure the RF emissions a0 operates the keyboard 15 to enter the measuring frequency, i.e., the designated frequency as a measuring parameter b (101). Then, the operator enters on the keyboard 15 the other measuring parameters, i.e., the origin for measurement D (xt, 0, zt) and the distances $\Delta x$ and $\Delta z$ between measuring points (102). In response, the controller 14 computes the position data of the magnetic probe 11 on the basis of the scanning parameters (103). The controller 14 determines the order in which signal data g should be read out, i.e., the scanning order of the probe 11 (probe scanning section 13) after the calculation of the position data. As a result, scanning data corresponding to the scanning order is generated (103). Usually, the probe 11 moves in the x axis direction and then in the z axis direction. The position data are written to the temporary memory circuit of the controller 14 and read out when needed. The probe scanning section 13 is located at a desired position beforehand.

On generating the scanning data (103), the controller 14 reads the scanning data (104). At this instant, since the scanning data of interest is the first scanning data, the controller 14 delivers a scanning control signal c to the motor driver 16 to move the probe 11 from the absolute origin C (0, 0, 0) to the origin for measurement D (xt, 0, zt). The scanning control signal c indicates the angle which the stepping motor of the probe scanning section 13 should rotate. In response, the motor driver 16 feeds to the probe scanning section 13 a shift signal d for a shift along the x axis or a shift signal e for a shift along the z axis, thereby moving the probe holder of the section 13 and, therefore, the probe 11 (105). The shift signals d and e are each represented by a particular number of pulses, so that the probe holder moves a distance proportional to the number of pulses.

As the displacement of the probe 11 is completed in a predetermined period of time, the controller 14 reads emission level signal data g which the spectrum analyzer 12 generates in response to the output of the probe 11 (106). Then, the controller 14 calculates the magnetic emission levels of the RF emissions a0 by using a predetermined equation (107). The calculated magnetic emission levels are divided into a plurality of zones and then transferred to the display 17 as emission level distribution signals h together with the position data. In response to the signals h, the display 17 displays the distribution of magnetic emission levels of the RF emissions a by a predetermined method, e.g., in different dot intensities (108). On completing the delivery of the signals h, the controller 14 determines whether or not the measurement specified by the measuring parameters has been completed (109). Of course, when the probe 11 is located at the origin for measurement D, the measurement has not completed. If the measurement has been completed, the sequence for measurement ends (110). If otherwise, the controller 14 returns to the step 104 to read the next scanning data meant for the probe scanning section 13 and then moves this section 13 for repeating the measurement.

Figure 5:
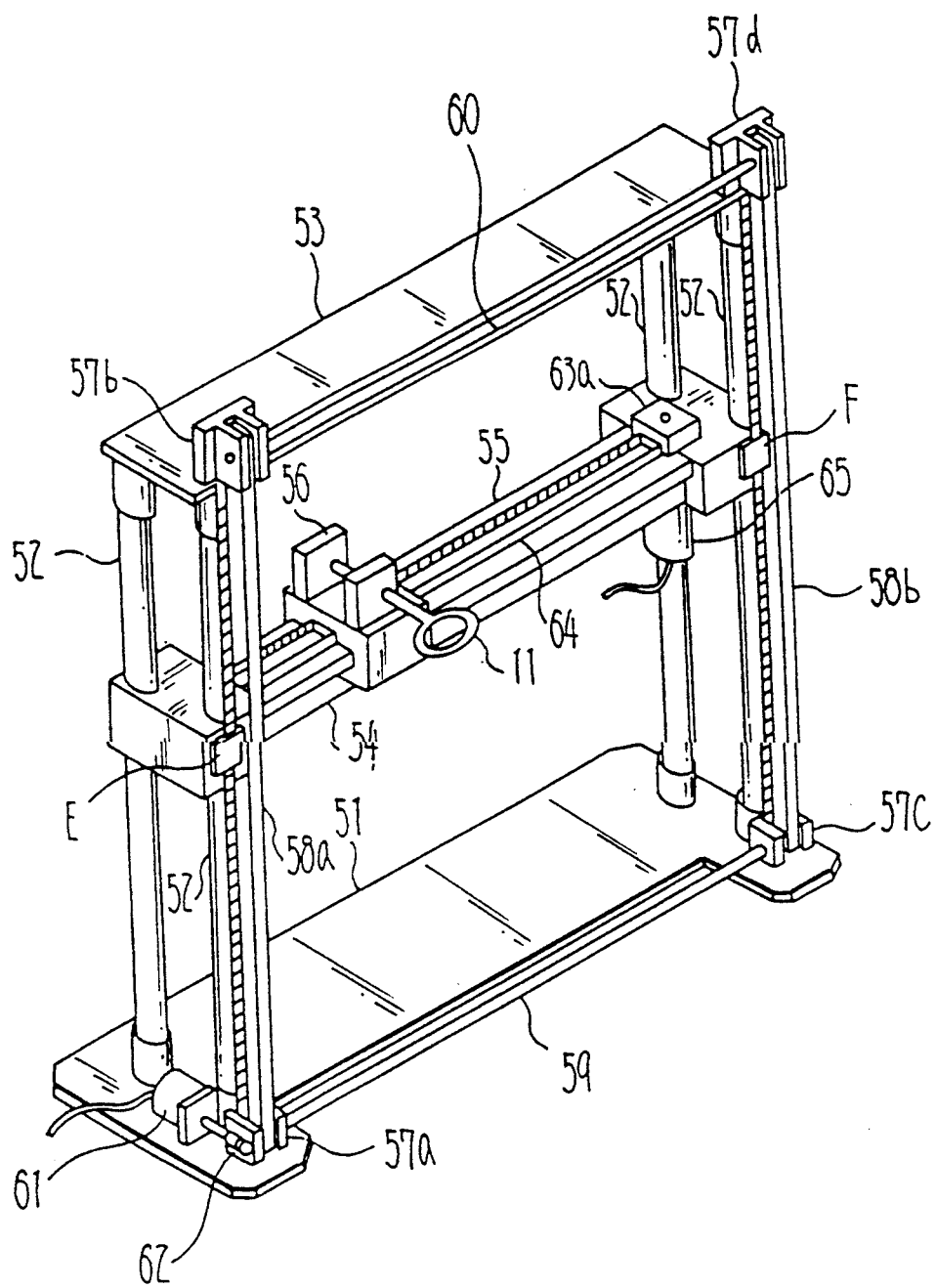
FIG. 5 is a perspective view showing a specific construction of a probe scanning section included in the embodiment.

As shown in FIG. 5, the entire probe scanning section 13 is stably affixed to a base in the form of a flat plate 51. Four upright cylindrical guidance bars 52 are affixed to the four corners of the base 51. The upper ends of the four guidance bars 52 are affixed to a top plate 53 which is parallel to the base or bottom plate 51. A cross bar 54 is configured as a structural body positioned inwardly of the four guidance bars 52 and in parallel with the base 51. The cross bar 54 is slidable up and down (z direction, FIG. 2) between the base 51 and the top plate 53 while being guided by the guidance bars 52. The guidance bars 52 each extends through a respective one of four holes formed in the cross bar 54, each of which holes is slightly larger in diameter than guidance bars 52. A guidance bar 55 is affixed to the cross bar 54 and extends between opposite ends of the latter. A probe holder 56 supports the magnetic probe 11 thereon and is slidable on the cross bar 54 in the horizontal direction (x direction, FIG. 2a) while being guided by the guidance bar 55.

A drive transmission mechanism for moving the cross bar 54 up and down is constructed as follows. Pulleys 57a and 57b are respectively affixed to one end of the base 51 adjacent to one of the guidance bars 52 and corresponding one end of the top plate 53. A belt 58a passes over the pulleys 57a and 57b and is affixed to the cross bar 54 at one intermediate point thereof. Pulleys 57c and 57d are respectively affixed to another end of the base 51 and corresponding one end of the top plate 53. A belt 58b passes over the pulleys 57c and 57d. The belts 58a and 58b are respectively affixed to points E and F which are positioned at opposite ends of the cross bar 54 at one intermediate point thereof. The pulley 57a is connected to the pulley 57c by a shaft 59 so that rotation of the former may be transmitted to the latter by the shift 59. Likewise, the pulley 57d is connected to the pulley 57d by a shaft 60 to transmit the rotation of the former to the latter via the shaft 60. The pulleys 57 (57a–57d) and the belts 58 (58a and 58b) are each gear-toothed to insure solid traction between the pulleys 57 the belts 58. In this configuration, the cross bar 54 is linearly driven by the belts 58a and 58b to move up and down as the pulleys 57a–57d are rotated, while being guided by the four guidance bars 52. A stepping motor 61 is drivably connected to the pulley 57a via a worm gear 62.

The probe holder 56 is slidable in the lengthwise direction of the cross bar 54 by being driven by the following drive transmission mechanism. Specifically, pulleys 63a and 63b (only 63a is shown) are mounted on opposite ends of the cross bar 54, i.e., adjacent to the guidance bars 52. A belt 64 passes over the pulleys 63a and 63b while the probe holder 56 is affixed to the belt 64 at one point thereof. As the belt 64 moves, the probe holder 56 slides on the cross bar 54 while being guided by the guidance bar 55. The pulleys 63a and 63b and the belt 64 mesh via each other with gear teeth.

The precise two drive transmission mechanisms described above allow the probe scanning section 13 to move the magnetic probe 11 bidimensionally with accuracy, thereby insuring accurate detection of a magnetic emission level distribution (or an electric emission level distribution when the magnetic probe is replaced with an electric probe) of RF emissions a.

The equipment 1 is required to measure weak RF emissions a from the EUT 2. It is necessary that the equipment 1 be prevented from disturbing the electromagnetic fields of RF emissions a. It follows that metal which is likely to disturb the electromagnetic emission level distribution should not be disposed around the probe 11 which is a sensor head sensitive to the distribution as far as possible. In light of this, the component parts of the probe scanning section 13 are made of non-metallic materials such as plastics and rubber except for the base 51, shafts 59 and 60, worm gear 61, and stepping motors 62 and 65. Especially, in the vicinity of the cross bar 54 carrying the probe 11 thereon, even the screws for affixing associated parts are made of a non-magnetic material.

Figure 6:
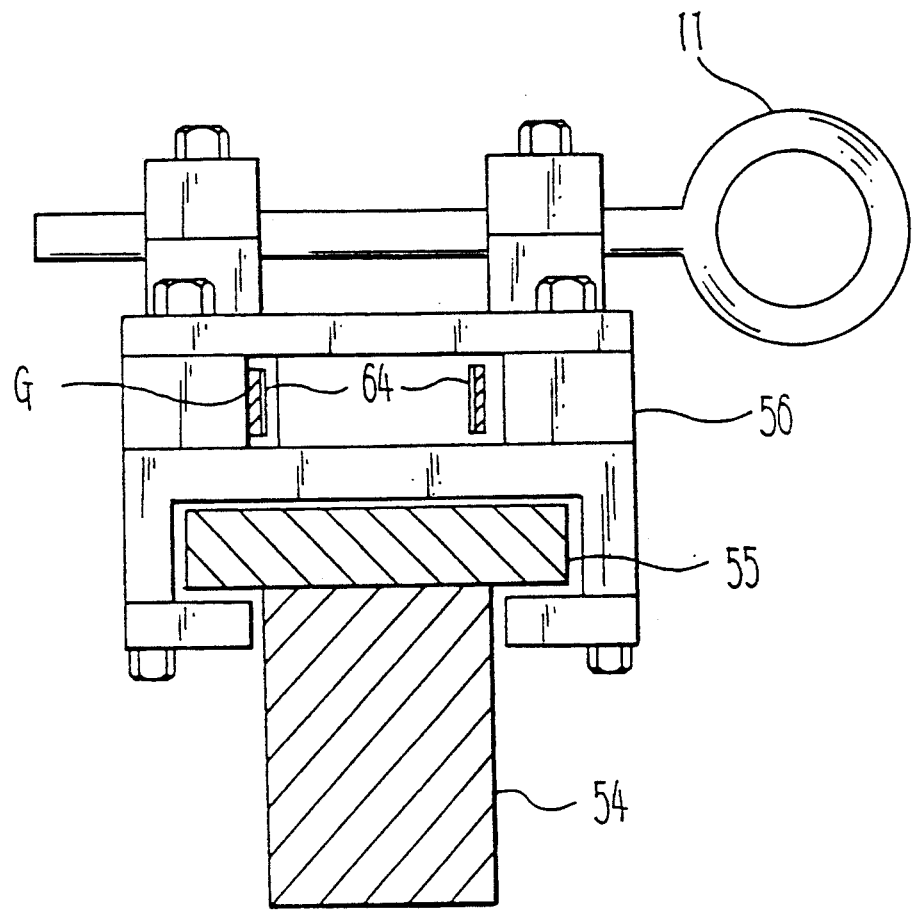
FIG. 6 is a side elevation showing a probe holder included in the probe scanning section of FIG. 5.

As shown in FIG. 6, the probe holder 56 is slidable on and along the guidance bar 55 mounted on the cross bar 54. The belt 64 passes over the pulleys 63a and 63b (not shown), and driven linearly in the lengthwise direction of the cross bar 54 (perpendicular to the sheet surface of FIG. 6) to in turn drive the probe holder 56. Since the belt 64 is affixed to one point G of the probe holder 56 at one point thereof, the probe holder 56 and the probe 11 mounted thereon slide in the lengthwise direction of the cross bar 54 in which the belt 64 moves. In this manner, the probe holder 56 is movable integrally with the belt 63.

Figure 7:
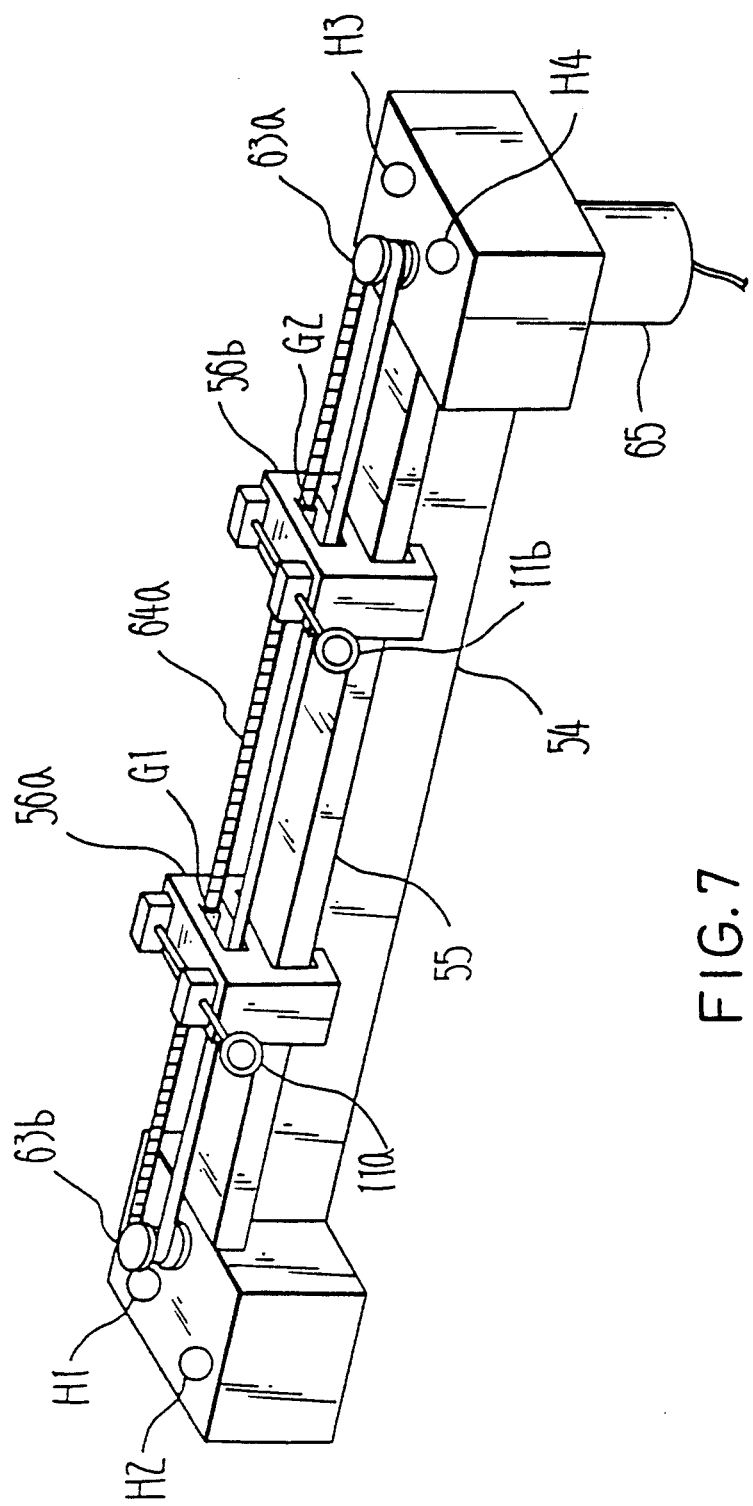
FIG. 7 is a perspective view showing another specific construction of the probe scanning section.

FIG. 7 shows another specific construction of the probe scanning section 13. As shown, the probe scanning section 13, like the section 13 of FIG. 5, has the cross bar 54, the guidance bar 55 affixed to the cross bar 54, and the pulleys 63a and 63b affixed to opposite ends of the cross bar 54. Four guidance bars 52, (not shown), extend through holes formed in the cross bar 54 at points H1-H4. The cross bar 54 is slidable up and down while being guided by the guidance bars 52. A belt 64a passes over the pulleys 63a and 63b. Two probe holders 56a and 56b are slidably mounted on the guidance bar 55. The probe holders 56a and 56b are respectively affixed to points G1 and G2 of the same run of the belt 64a. In this configuration, the probe holders 56a and 56b are driven by the belt 64a at the same time, in the direction in which the points G1 and G2 of the belt 64a move. The pulley 63a is rotatable by the stepping motor 65.

With the probe scanning section 13 shown in FIG. 7, the equipment 1 shown in FIG. 1 can detect the magnetic fields of the RF emissions a by two magnetic probes 11a and 11b on a time division basis. Therefore, the scanning distance of each of the probe holders 56a and 56b is one half of the scanning distance of the probe holder 56 shown in FIG. 5. The scanning speed of the probe holder 56 or that of the probe holders 56a and 56b is far lower than the speed at which the magnetic fields of RF emissions a are detected since the scanning operation is mechanical. It follows that the probe scanning section of FIG. 7 can perform magnetic field scanning over a given distance in approximately one half of the time which the probe scanning section 13 of FIG. 5 needs. Further, when the length of the cross bar 54, guidance bar 55 and belt 64 is increased (x direction), an approximately twice longer distance can be scanned for a given scanning time.

Although the invention has been described with reference to specific embodiments thereof, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments falling within the true scope of the invention.

What is claimed is:

1. Bidimensional electromagnetic emission level monitoring equipment comprising:

an electromagnetic probe for detecting electromagnetic fields;

selective receiving means for separating components having a designated frequency from said fields and generating emission level signals representative of emission levels of said fields having said designated frequency;

outputting means associated with said selective receiving means for outputting emission level signal data corresponding to said emission level signals;

a probe scanning section for carrying said electromagnetic probe thereon and for moving said electromagnetic probe in bidimensional directions in a bidimensional plane;

inputting means for inputting scanning parameters designating a measuring frequency of said fields to be measured and effective for measuring points where said electromagnetic probe should detect said fields;

controller means for supplying to said selective receiving means a frequency corresponding to said measuring frequency entered on said inputting means as said designated frequency;

means for generating position data representative of said measuring points on the basis of said scanning parameters entered on said inputting means and for feeding to said probe scanning section a scanning control signal produced by converting said position data to a displacement of said electromagnetic probe; and means for generating electromagnetic emission level data by calculating electromagnetic emission levels in response to said emission level signal data and outputting said electromagnetic emission level data together with said position data as an emission level distribution signal representative of an electromagnetic emission level distribution;

wherein said probe scanning section comprises:

a base in the form of a plate for supporting said probe scanning section;

a plurality of first guidance bars extending vertically from and affixed to opposite end portions of said base at one end thereof;

a cross bar provided between and perpendicular to said plurality of first guidance bars and slidable with opposite ends thereof guided by said first guidance bars;

a first stepping motor to which a shift signal from a motor driver is applied for causing said cross bar to slide;

a first drive transmission mechanism for converting a rotary motion of said first stepping motor to a linear motion for driving said cross bar;

a second guidance bar extending between opposite ends of said cross bar;

a probe holder for holding said electromagnetic probe and for sliding on said cross bar while being guided by said second guidance bar;

a second stepping motor to which said shift signal from said motor driver is applied for causing said probe holder to slide; and a second drive transmission mechanism for converting a rotary motion of said second stepping motor to a linear motion for driving said probe holder.

2. Equipment as claimed in claim 1, further comprising a top plate affixed to the other end of said plurality of first guidance bars and extending parallel to said base.

3. Equipment as claimed in claim 1, wherein said first drive transmission mechanism comprises:

pulleys each affixed to opposite end portions of said plurality of first guidance bars, the rotary motion of said first stepping motor being transmitted to one of said pulleys by a worn gear; and a belt passing over two of said pulleys and affixed to opposite end portions of said first guidance bars, and affixed at one point to said cross bar.

4. Equipment as claimed in claim 3, wherein said pulleys and said belt mesh with each other with gear teeth.

5. Equipment as claimed in claim 3, wherein at least one of said pulleys located at corresponding positions in the opposite end portions of said base is interconnected by a shaft.

6. Equipment as claimed in claim 1, further including;

pulleys affixed to opposite end portions of said second guidance bar, the rotary motion of said second stepping motor being applied to one of said pulleys; and a belt passing over said pulleys and affixed to the opposite ends of said second guidance bar, and affixed at one end to said probe holder.

7. Equipment as claimed in claim 1, wherein said probe scanning section is made of a non-magnetic material except for said base and said first and second stepping motors.

8. Equipment as claimed in claim 5, wherein said probe scanning section is made of a non-magnetic material except for said base, said first and second stepping motors, and said shaft.

* * * * *